United States Patent [19]
Sandstrom et al.

[11] Patent Number: 6,005,879
[45] Date of Patent: Dec. 21, 1999

[54] PULSE ENERGY CONTROL FOR EXCIMER LASER

[75] Inventors: Richard L. Sandstrom, Encinitas; Herve Andre Besaucele; Igor V. Fomenkov, both of San Diego; Palash P. Das, Vista, all of Calif.

[73] Assignee: Cymer, Inc., San Diego, Calif.

[21] Appl. No.: 09/034,870

[22] Filed: Mar. 4, 1998

Related U.S. Application Data

[63] Continuation-in-part of application No. 08/842,305, Apr. 23, 1997, Pat. No. 5,835,520, which is a continuation-in-part of application No. 08/947,474, Oct. 10, 1997.

[51] Int. Cl.$^6$ ........................................... H01S 3/00
[52] U.S. Cl. ................................. 372/25; 372/57
[58] Field of Search ............................ 372/25, 57

[56] References Cited

U.S. PATENT DOCUMENTS

| | | | |
|---|---|---|---|
| 5,128,601 | 7/1992 | Orbach et al. | 372/25 |
| 5,168,400 | 12/1992 | Moses | 372/25 |
| 5,463,650 | 10/1995 | Ito et al. | |
| 5,710,787 | 1/1998 | Amada et al. | |
| 5,710,878 | 1/1998 | Amada et al. | 372/25 |
| 5,835,520 | 11/1998 | Das et al. | 372/57 |

*Primary Examiner*—Leon Scott, Jr.
*Attorney, Agent, or Firm*—John R. Ross, Esq.

[57] ABSTRACT

A process for controlling pulse energy and integrated energy dose in bursts of pulses produced by an excimer laser. The energy of each pulse in each burst is measured. The rate of change of pulse energy with charging voltage is determined. A pulse energy error is determined for a previous pulse of the present burst. An integrated dose error is also determined for all previous pulses in the current burst. A charging voltage for the next pulse is determined using the pulse energy error, the integrated dose error, the rate of change of energy with charging voltage and a reference voltage. In a preferred embodiment, the rate of change of energy with voltage is determined by dithering the voltage during two pulses of each burst, once lower and once higher. The reference voltage is a voltage calculated using prior energy and voltage data. In this embodiment, the method of determining the reference voltage during a first portion of the pulse is different from the method used during a latter portion of the burst. During the first set of pulses (40 in this embodiment), for each pulse, a specified voltage calculated using voltage and energy data from a corresponding pulse in a previous burst is utilized as a prediction of the voltage needed to produce a pulse energy converging on a target pulse energy. For pulses 41 and thereafter the reference voltage for each pulse is the specified voltage for the previous pulse.

13 Claims, 8 Drawing Sheets

PULSE ENERGY CONTROL FOR EXCIMER LASER

This invention relates to excimer lasers and, in particular to narrow band excimer lasers. This invention is a continuation-in-part application of Ser. No. 08/842,305, filed Apr. 23, 1997, now U.S. Pat. No. 5,835,520, which is a continuation-in-part Ser. No. 08/947,474, filed Oct. 10, 1997.

BACKGROUND OF THE INVENTION

KrF excimer lasers are rapidly becoming the most important light source for integrated circuit lithography. Although these lasers are very complicated machines, their reliability has greatly improved during the past few years, and they are currently being integrated into full-scale integrated circuit production.

Figure 1:
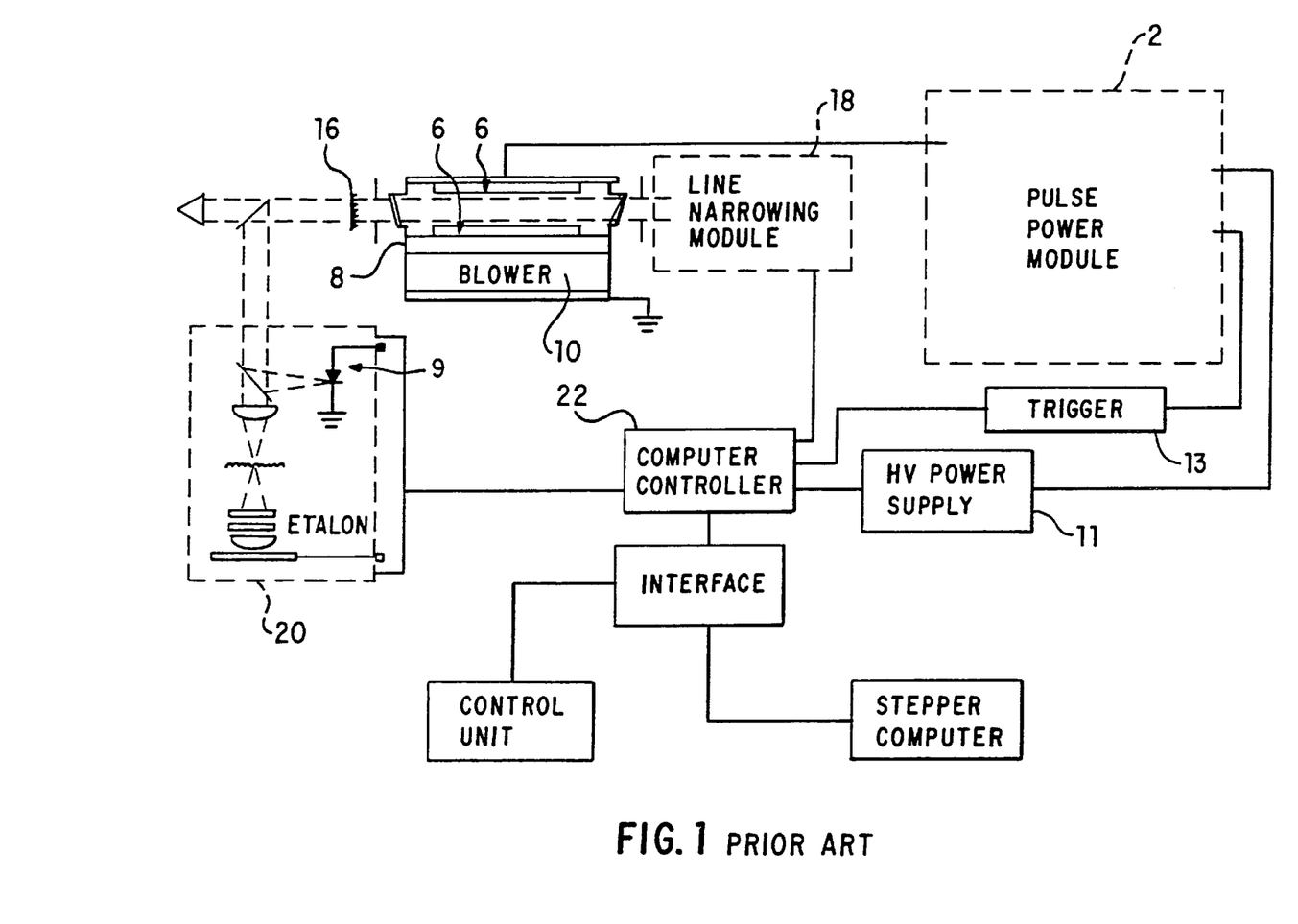
FIG. 1 is a drawing showing the principal elements of a prior art commercial KrF excimer laser used for integrated circuit lithography.

A detailed description of a KrF laser system is described in U.S. Pat. No. 4,959,840 issued Sep. 25, 1990 (incorporated herein by reference), and assigned to Applicants' employer. As explained in that patent, the excimer laser gain medium is produced by electric discharges between two elongated electrodes in a flowing gas medium which may be a combination of krypton, fluorine and a buffer gas, neon. The proportions are typically 0.1 percent fluorine, 1.0 percent krypton and the rest neon. The operating pressure is about 3 atmospheres. FIG. 1 is a drawing showing the important features of such a laser.

Typical lithography lasers currently being sold today for lithography operate at a high pulse rate of about 600 to 1,000 Hz. This is the reason it is necessary to circulate the laser gas through the space between the electrodes. This is done with tangential blower located below the electrodes in the laser discharge chamber. The laser gases are cooled with a heat exchanger also located in the chamber. Commercial excimer laser systems are typically comprised of several modules which may be replaced quickly without disturbing the rest of the system. Principal modules are shown in FIG. 1 and include:

Laser Chamber 8,

Pulse Chamber 8,

Pulse Power Module 2,

Output coupler 16,

Line Narrowing Module 18

Wavemeter 20

Computer Control Unit 22

Figure 2:
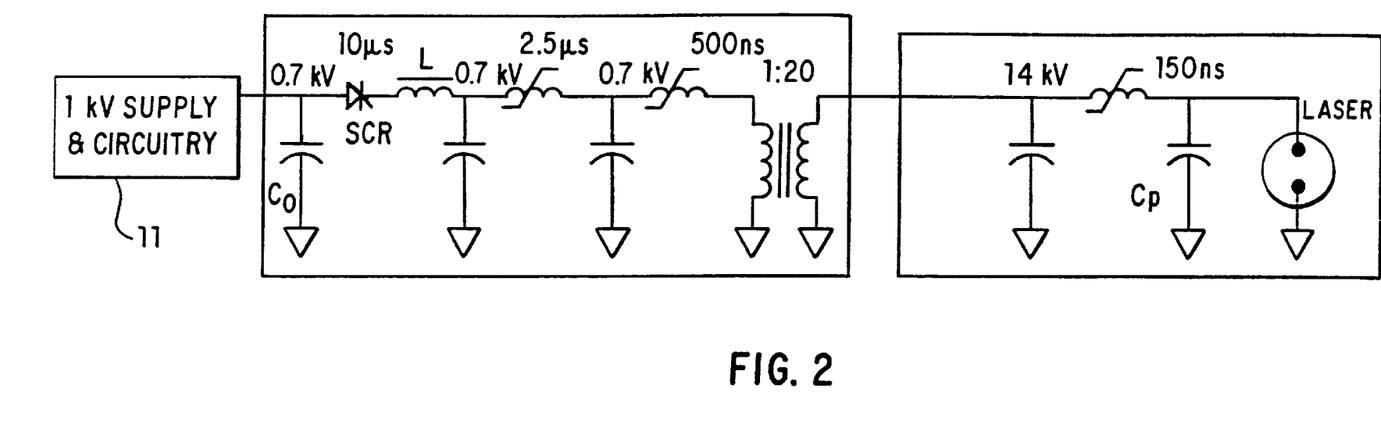
FIG. 2 is a simplified electrical drawing of a solid state pulse power circuit.

The energy per pulse from these lasers in about 10 mJ and the duration of the laser pulses is about 15 ns. Thus, the average power of the laser beam at 600 to 1,000 Hz is about 6 to 10 Watts and the average power of the pulses is in the range of about 700 KW. FIG. 2 is a drawing showing the principal elements of the high voltage power supply for the laser. The voltage on capacitor Co is delivered by a 1 kv power supply in the form of DC pulses in the range of about 500 to 800 volts and is called the "charging voltage". The voltage on capacitor Cp which is also the voltage across the electrodes is also a DC pulse in range of about 12,0000 to 20,000 volts and is called the discharge voltage. The high voltage power supply system compresses the charging voltage pulse from a duration of about 0.7 ms to produce a discharge voltage pulse of about 200 ns. The discharge voltage is approximately proportioned to the charging voltage.

It is known that within the normal operating range of the KrF laser, output pulse energy can be increased by increasing the pulse discharge voltage; and it can be increased by increasing the fluorine concentration. Increases or decreases in both or either of these parameters is easily accomplished with these narrow band KrF excimer lasers; however, the pulse discharge voltage can be changed very quickly and accurately (i.e., a time intervals of less than 1 millisecond with an accuracy of less than 1%.) whereas changing the fluorine concentration requires much more time and the fluorine concentration controls are not currently very accurate.

Fluorine gas is extremely reactive, and in spite of great efforts to utilize materials which are compatible with fluorine, reactions occur continuously in the chamber depleting the fluorine, especially during and immediately following the electrical discharges during which time the fluorine is ionized.

Figure 3:
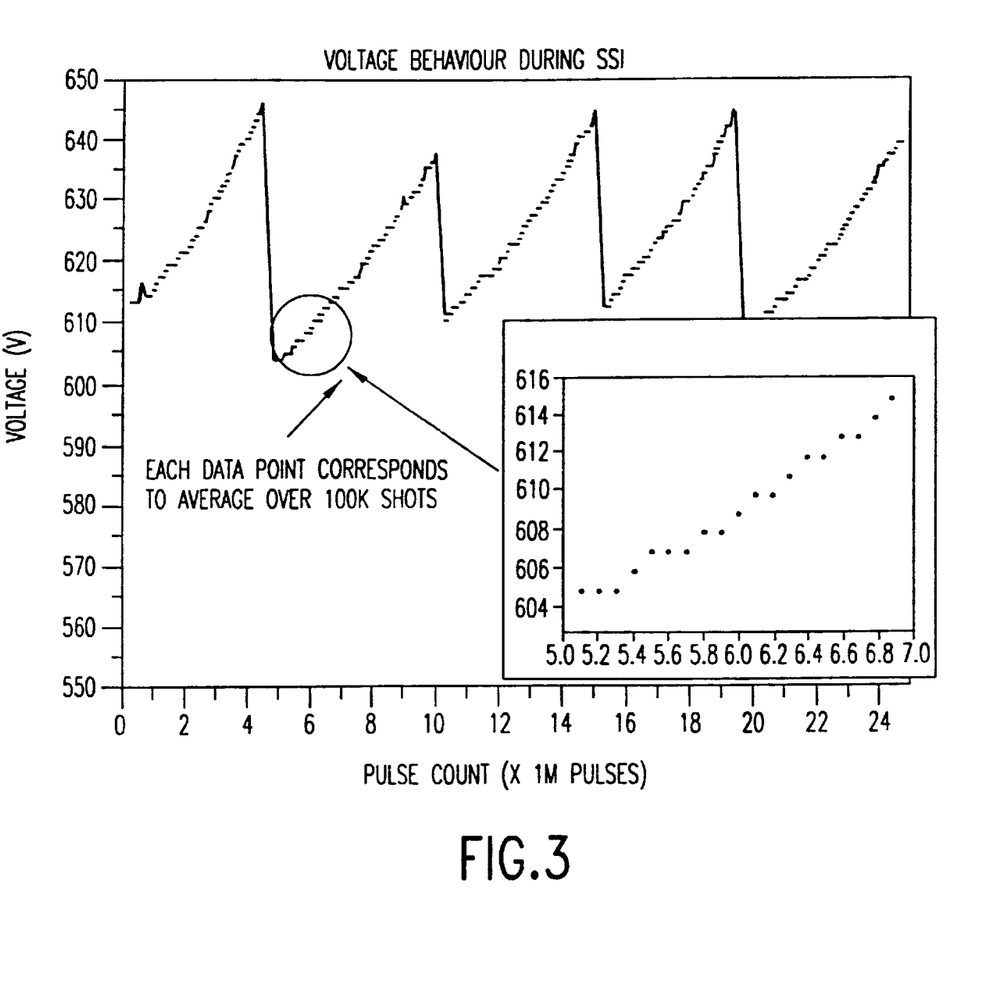
FIG. 3 is a graph of charging voltage versus pulse counts for a typical prior art KrF laser showing effects of fluorine depletion and periodic injection.

A typical operating plan for producing constant laser pulses is to compensate for the fluorine depletion by increases in the discharge voltage. This is accomplished with a feedback control which monitors pulse energy on a "per pulse" basis at pulse frequencies such as 1,000 Hz and controls the voltage to maintain substantially constant pulse energy as the fluorine concentration decreases over time and increases when new fluorine is injected. Normally the operating plan will encompass a voltage control range so that when the charging voltage increases needed to compensate for the depleted fluorine, reach an "upper limit" (usually requiring a period of about two hours), a quantity of fluorine is injected during a period of a few seconds. The quantity injected is predetermined to correspond roughly to the quantity which would have been depleted over the two-hour period. During the fluorine injection period, the automatic feed back control will force the voltage down in order to keep pulse energy substantially constant so that at the end of the injection period the voltage is approximately at the low level of the voltage operating range and fluorine concentration is approximately at its high level. Prior art techniques are in use in which this injection is performed automatically by the control system for the laser. The start of the injection process is triggered by the charging voltage reaching or exceeding the above upper limit. During the next two hours, the process will repeat, and this general process may continue for several days. FIG. 3 shows a graph of average voltage as a function of pulse count for an operating unit. Note that at a pulse rate of 1,000 Hz, 1 million pulses correspond to about 16 minutes, and that for continuous operation, the injection period would be at intervals of about 1.3 hours, corresponding to about 5,000,000 pulses. (Often these lasers run at a duty factor of about 20–60 percent. This is because the lasers normally do not operate when the lithography tool is changing positions, which increases the time interval between injections to about several hours.)

Typical KrF lasers have a fairly broad possible range of operation in terms of discharge voltage and fluorine concentration within which a desired pulse energy can be achieved. For example, in one such laser the charging voltage range is from 567 volts to 790 volts, with the corresponding fluorine pressure range being 36.5 kPa to 18.5 kPa. A lithographer may choose any operating range within the laser's charging voltage range of for example, 567 volts to 790 volts. Prior art procedures for selecting the range have not been well thought out. One manufacturer has recommended operation at 75% of the maximum voltage. Another suggested the range be determined based on pulse energy transfer efficiency. Choosing a range that is solely determined by a maximum energy transfer efficiency or within some specific voltage range may severely limit the operating range of the laser. Also, as described in U.S. Pat. No. 5,142,166; by using energy recovery circuits, even if the laser is not operated in maximum energy transfer efficiency regime, the residue energy in the circuit can be recovered for the subsequent pulse. Choosing the correct range can be important because both the operating life of the laser is adversely affected by increased fluorine concentration and also by increased discharge voltage.

Pulse energy variation, called "energy sigma" is very important to integrated circuit lithographers. Energy sigma is the standard deviation from the mean energy of pulse energy in a series of pulses. Specifications on energy sigma are typically in the range of about 3 percent, but desired values may be much smaller. Prior art excimer lasers comprise feedback voltage control which automatically adjusts the discharge voltage of each pulse based on the monitored energy of the preceding pulse or pulses. Lithography lasers may be operated in a continuous mode at pulse rates such as 1,000 Hz in which case it is relatively easy to keep energy sigma small utilizing the pulse energy-voltage feedback control. However, a more typical mode of operation is called the burst mode in which the laser is operated at a pulse rate of 1,000 Hz for about 110 pulses followed by a dead time of a fraction of a second such as about 0.2 second, to a few seconds or longer. During these dead times the wafer being illuminated is either stepped (i.e., moved a few millimeters) or a treated wafer is replaced with a to-be-treated wafer or a new cassette of wafers is moved into place. In addition to controlling energy sigma, it is in many situations even more important to control the total dose during each pulse to as close as possible to a target value.

If the laser is operated in a burst mode at constant voltage, the result is a wide swing in pulse energy during the first 40 milliseconds of the burst. Prior art energy feedback control circuits only partially reduce the energy variations. It is known that the swings are relatively repetitive from burst to burst. Therefore, attempts have been made to program the voltage control with time dependent algorithms in order to reduce the pulse energy variation during these first 40 pulses.

What is needed is better techniques for reducing the energy sigma during burst mode operation.

SUMMARY OF THE INVENTION

The present invention provides a process for controlling pulse energy and integrated energy dose in bursts of pulses produced by an excimer laser. The energy of each pulse in each burst is measured. The rate of change of pulse energy with charging voltage is determined. A pulse energy error is determined for a previous pulse of the present burst. An integrated dose error is also determined for all previous pulses in the current burst. A charging voltage for the next pulse is determined using the pulse energy error, the integrated dose error, the rate of change of energy with charging voltage and a reference voltage. In a preferred embodiment, the rate of change of energy with voltage is determined by dithering the voltage during two pulses of each burst, once lower and once higher. The reference voltage is a voltage calculated using prior energy and voltage data. In this embodiment, the method of determining the reference voltage during a first portion of the pulse is different from the method used during a latter portion of the burst. During the first set of pulses (40 in this embodiment), for each pulse, a specified voltage calculated using voltage and energy data from a corresponding pulse in a previous burst is utilized as a prediction of the voltage needed to produce a pulse energy converging on a target pulse energy. For pulses 41 and thereafter the reference voltage for each pulse is the specified voltage for the previous pulse.

DETAILED DESCRIPTION OF PREFERRED EMBODIMENTS

Selecting an Operating Range

A preferred process for selecting the operating range for a narrow band KrF excimer laser is described below.

This procedure permits a selection of the operating range to achieve improved laser performance, giving specific consideration to four important laser parameters. These parameters are discussed below. This embodiment refers specifically to a Model ELS-5000 KrF excimer laser available from Cymer, Inc., with offices in San Diego, Calif.; but the principles discussed herein can be applied with respect to any narrow band KrF or ArF excimer laser.

Charging Voltage

The possible voltage range for this particular excimer laser was 567 volts to 790 volts. The lifetime of several components of the laser, particularly the electrodes, and to a lesser extent chamber windows and pulse power equipment, are affected by operating voltage level. The higher the voltage, the more adverse the effect.

Fluorine

The possible fluorine concentration range for this particular laser was about 18.5 kPa to 36.8 kPa corresponding to the above voltage range. High fluorine concentration also adversely affects the lifetime of laser components coming in contact with the gas. This includes windows, fan bearings and electrodes.

Line Width

For a narrow band excimer laser used in integrated circuit lithography, the bandwidth is very important. The preciseness of the circuit components depend on the bandwidth being within required limits. Specifications typically require a bandwidth of less than 1.0 pm for a KrF laser, but the desired bandwidth may be substantially smaller.

Energy Variation

Pulse energy variation, called "energy sigma," is also very important to integrated circuit lithographers. Specifications usually require an energy sigma of less than 3%, but the desired variation may be much smaller.

Range Selection Process

This preferred range selection process permits a careful, well-considered selection of an operating range to provide the best overall results taking into consideration all four of the above parameters and the needs of the particular lithographer.

Process

Step 1: Operate the laser at a desired pulse energy for a period of time sufficient to allow the fluorine concentration to decrease to a level corresponding to the upper limit of the discharge voltage.

Step 2: Record the charging voltage, line width energy sigma and estimated fluorine concentration.

Step 3: Inject a quantity of fluorine $\Delta F_1$. (Choose $\Delta F_1$ to be about 1/10 the difference in Fluorine concentration corresponding to the lowest charging voltage to produce the desired pulse energy and the fluorine concentration corresponding to the highest charging voltage to produce the desired pulse energy. Operate the laser for 5 minutes, then Step 4: Record (F est+$\Delta F_1$).

Step 5: Inject a second quantity of Fluorine $\Delta F_2$.

Step 6: Record charging voltage, line width, energy sigma estimated fluorine concentration (roughly F est+$\Delta F_1$+$\Delta F_2$).

Step 7: Inject a third quantity of fluorine $\Delta F_3$.

Continue the above procedure until the lower limit of voltage is reached, and record at each step, the discharge voltage, line width, energy sigma and estimated fluorine. Your data sheet should look similar to Table I which is actual data from a Model ELS-5000 laser produced by Cymer, Inc., San Diego, Calif.

TABLE 1

Actual data from ELS-5000 laser.
Data from your laser may be different, but will follow the same trends.

| Number of Injects | Cumulative F2* Pressure (kPa) | Average Voltage (Volts) | Linewidth (pm) | Energy Sigma (%) |
|---|---|---|---|---|
| 0 | 18.5 | 790 | 0.44 | 2.5 |
| 1 | 20.5 | 690 | 0.44 | 1.9 |
| 2 | 22.5 | 632 | 0.45 | 1.6 |
| 3 | 24.5 | 618 | 0.46 | 1.5 |
| 4 | 26.5 | 598 | 0.47 | 1.7 |
| 5 | 28.5 | 584 | 0.49 | 1.7 |
| 6 | 30.5 | 575 | 0.49 | 1.7 |
| 7 | 32.5 | 571 | 0.50 | 1.8 |
| 8 | 34.5 | 568 | 0.51 | 1.8 |
| 9 | 36.5 | 567 | 0.52 | 1.8 |

*NOTE: This is 1 percent $F_2$ in a buffer gas, such as Neon or Helium.

Figure 4:
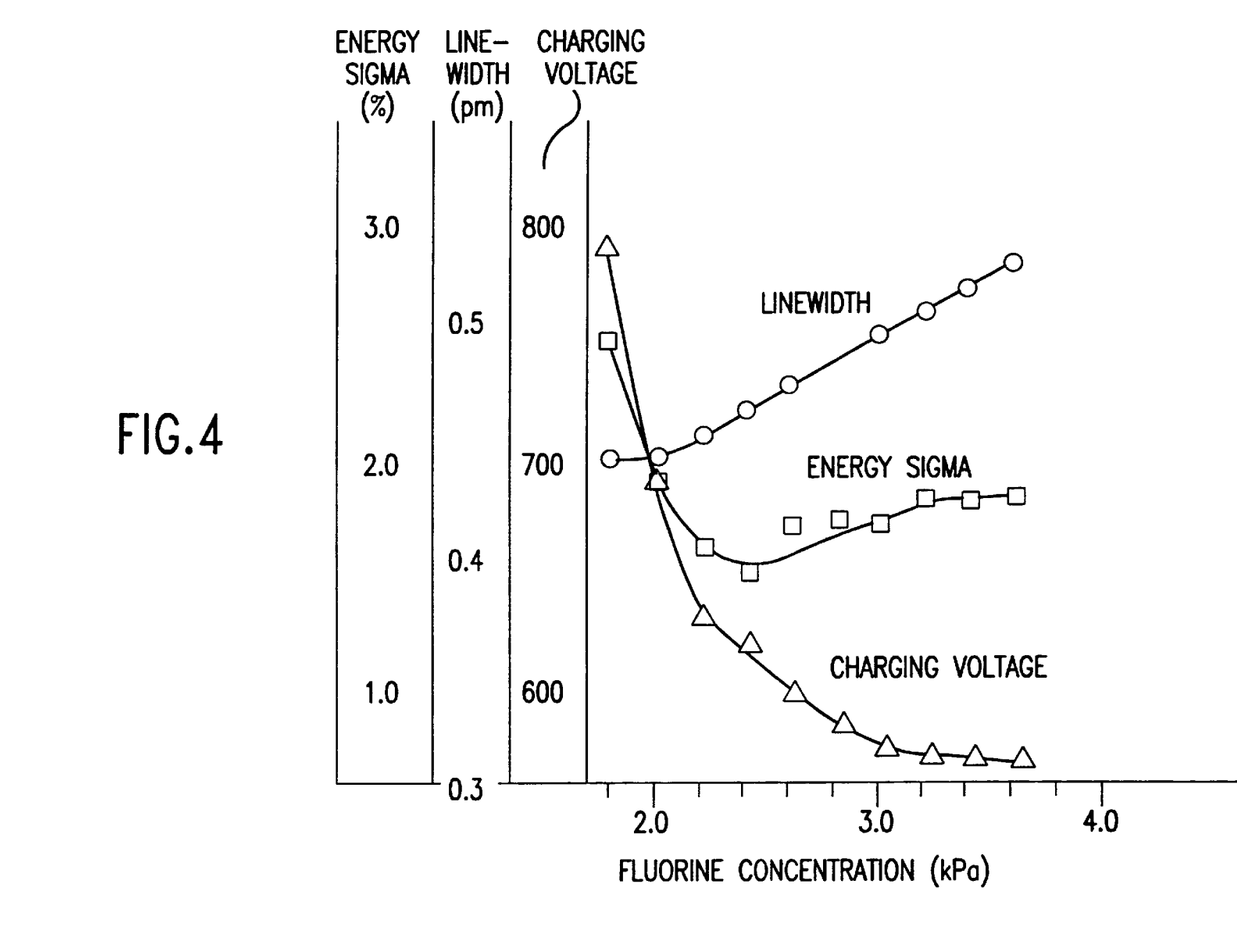
FIG. 4 shows the relationship between charging voltage and fluorine concentration to produce 10 mJ pulses; also shown is linewidth and energy signal as a function of fluorine concentration.

Plot the data. The data from the above table is plotted in FIG. 4. Use the graph to select an operating range. The range could cover about 40 volts. The selection is a trade-off among the four parameters shown on the graph. For example, if low voltage is of over-riding importance, the chosen range might be 570 volts to 610 volts. If low fluorine and minimum line width is of over-riding importance, the chosen range might be 760 volts to 800 volts. If energy reliability is of over-riding importance, the choice would be about 600 volts to 640 volts. A range which provides a reasonable trade-off among all four parameters would be about 595 volts to about 635 volts.

Importance of Accurate $\Delta E/\Delta V$

Prior art methods of controlling the output pulse energy generally measure the deviation from a desired target energy, and then calculate a correction to the charging voltage for the next pulse which is intended to produce a closer approximation to the desired energy. The amount of the correction in prior art has been either a constant increment (or decrement) of the voltage, or an increment which is proportional to the energy error. This proportionality constant has in prior art been fixed: for example, the charge voltage might be reduced by 50 volts for every +1 mJ error in the energy. In these control schemes, the proportionality constant is a fixed parameter of the control software, and is determined experimentally ahead of time by the laser designer. The ideal value of this proportionality constant is derived from the local derivative (slope) of the energy versus voltage curve, dE/dV. Given an energy error, the voltage correction should be $\Delta V=\Delta E/(dE/dV)$, where $1/(dE/dV)$ is the constant of proportionality previously discussed.

Figure 5:
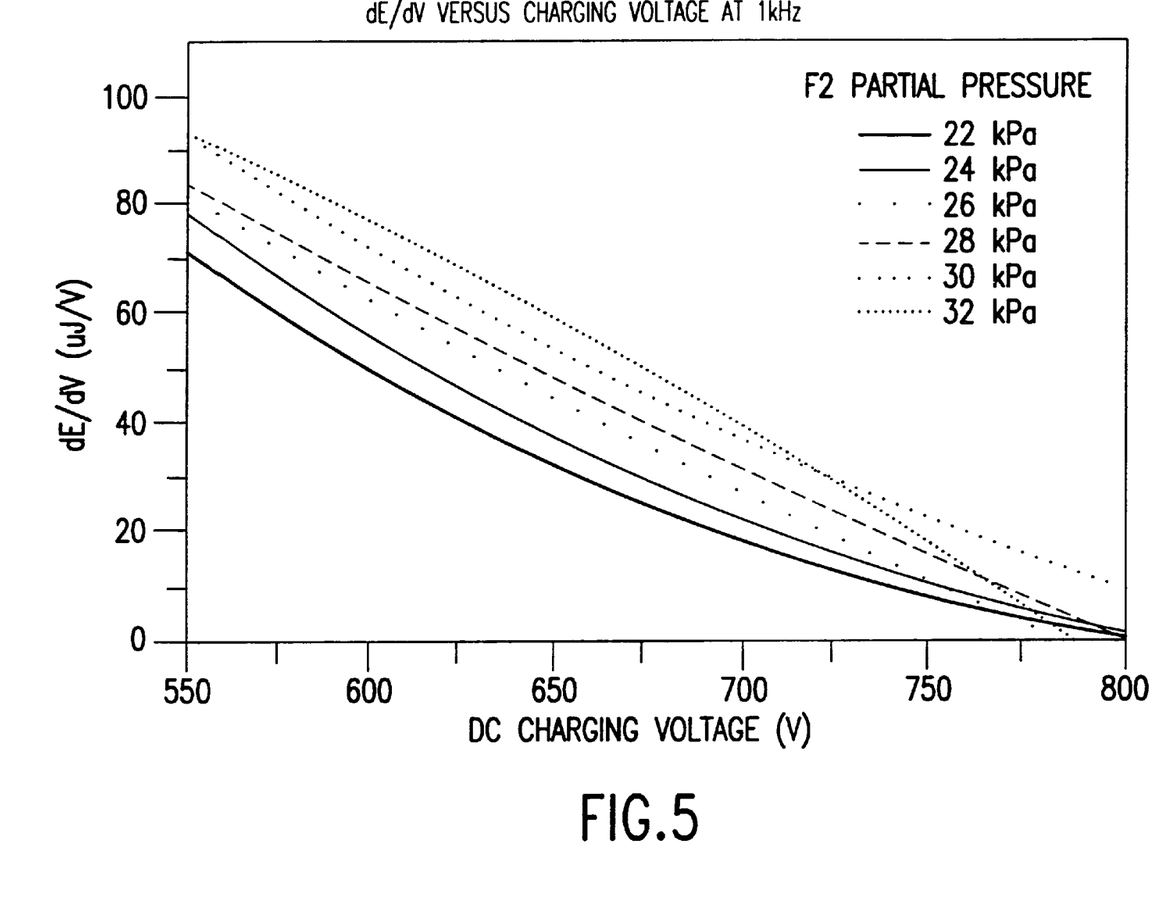
FIG. 5 shows the relationship of $\Delta E/\Delta V$ with charging voltage.
Figure 6:
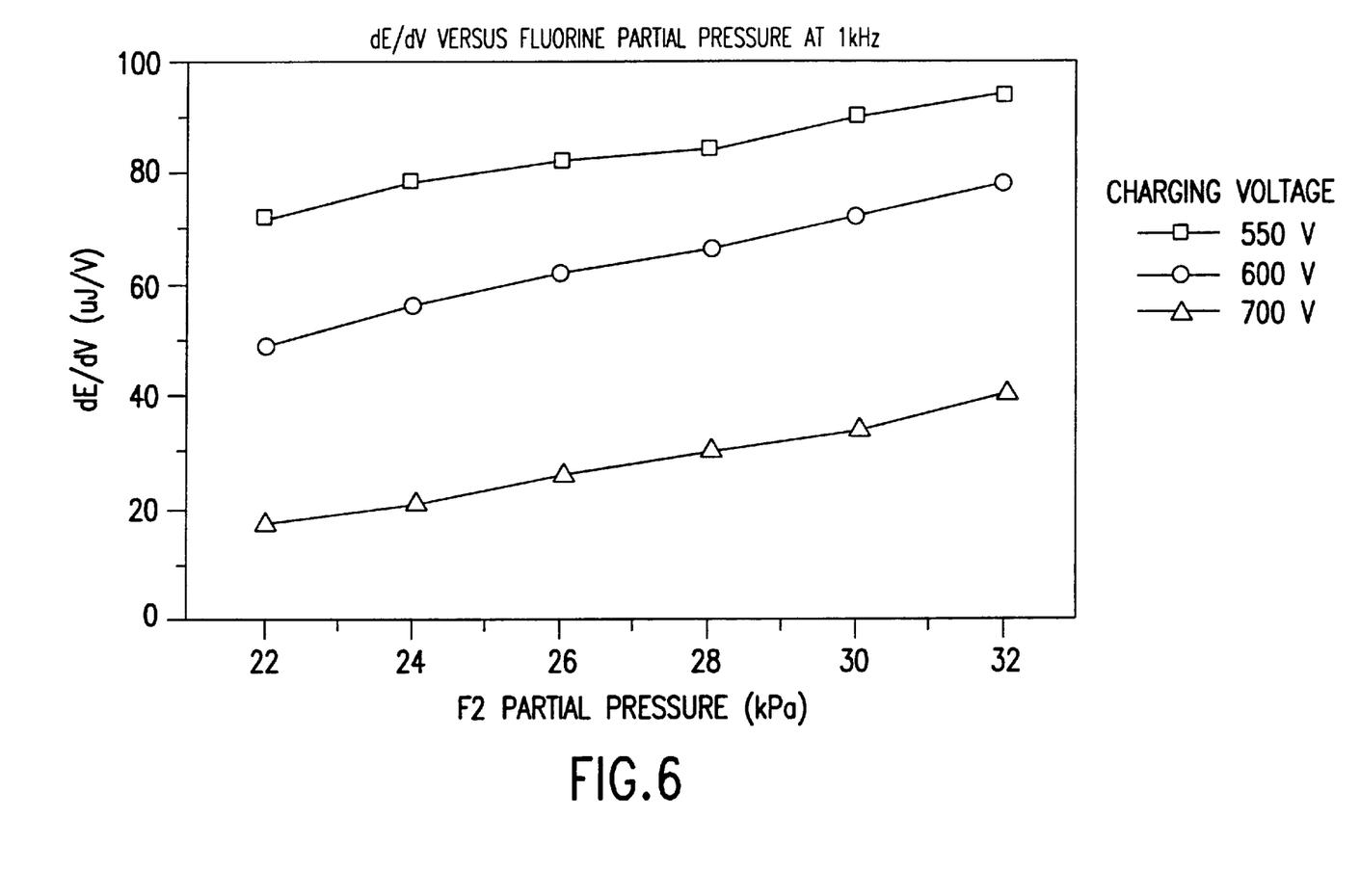
FIG. 6 shows the relationship of $\Delta E/\Delta V$ with fluorine concentration at 550 volts, 600 volts and 700 volts.
Figure 7:
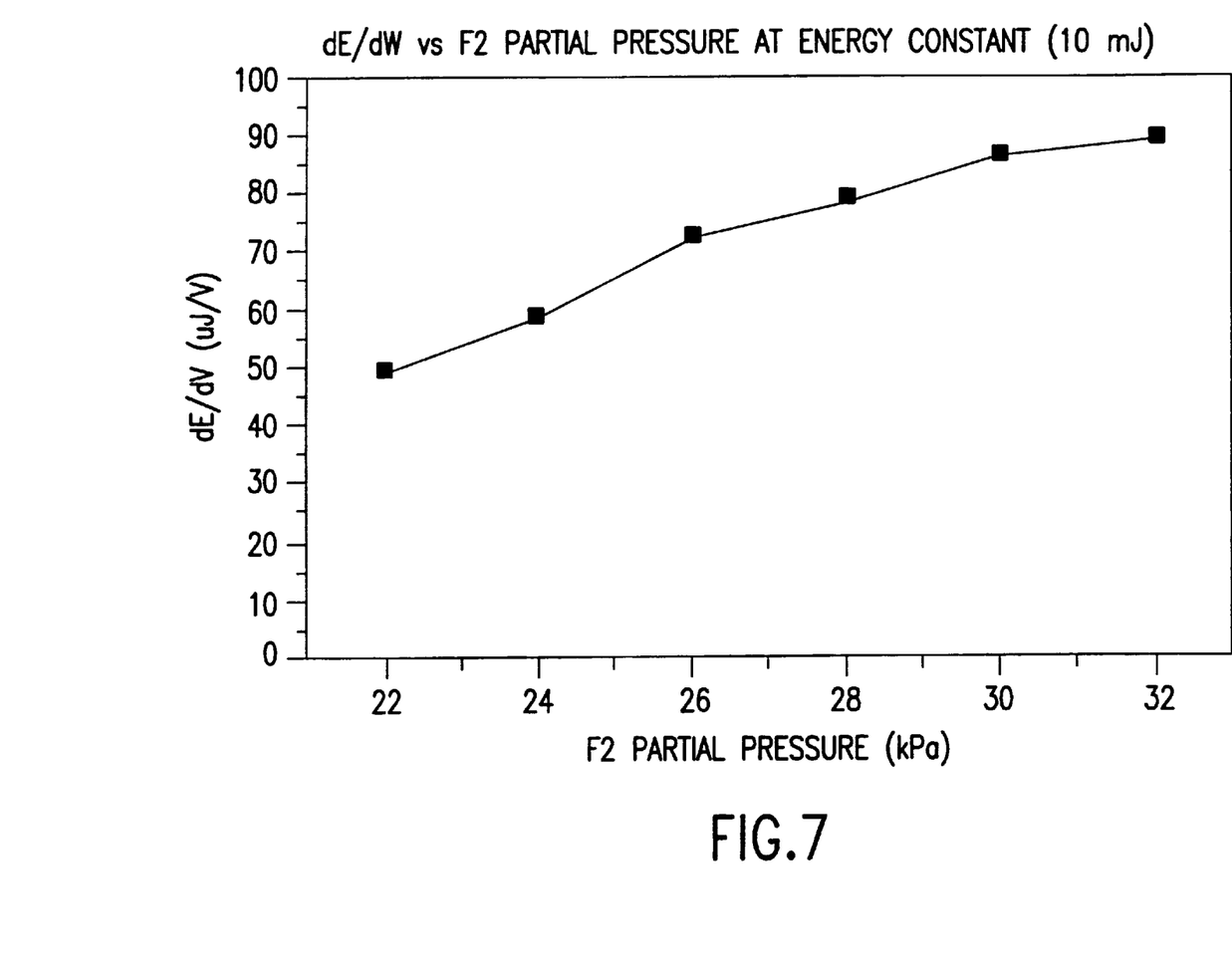
FIG. 7 shows the relationship of $\Delta E/\Delta V$ with fluorine concentration at constant pulse energy.

It is important that the value for dE/dV be accurately set, since this affects how quickly and accurately the control algorithm converges to the target energy. A value of 1/(dE/dV) which is too small will lead to slow and inaccurate convergence. Conversely, a value of 1/(dE/dV) which is too large can lead to violent instability in the control algorithm. Unfortunately, dE/dV is not a constant, but can vary over time due to various factors such as operating voltage, fluorine concentration, gas temperature, aging of components, etc. FIG. 5 shows a representative graph of dE/dV as a function of charging voltage for various fluorine concentrations (the energy is not a constant). FIG. 6 shows dE/dV as a function of fluorine concentration at three different voltage levels. As a result, the control schemes described in prior art have been forced to set the proportionality constant to a much smaller than optimal value, to insure that the algorithm does not go unstable under some conditions.

It is the intent of the control scheme described in this patent to provide a way to directly measure the parameter dE/dV in a semi-continuous manner, in a way which does not require interruption of the operation of the laser, thereby providing at all times the optimum control of the laser energy.

Control of $F_2$ Injection

Figure 8:
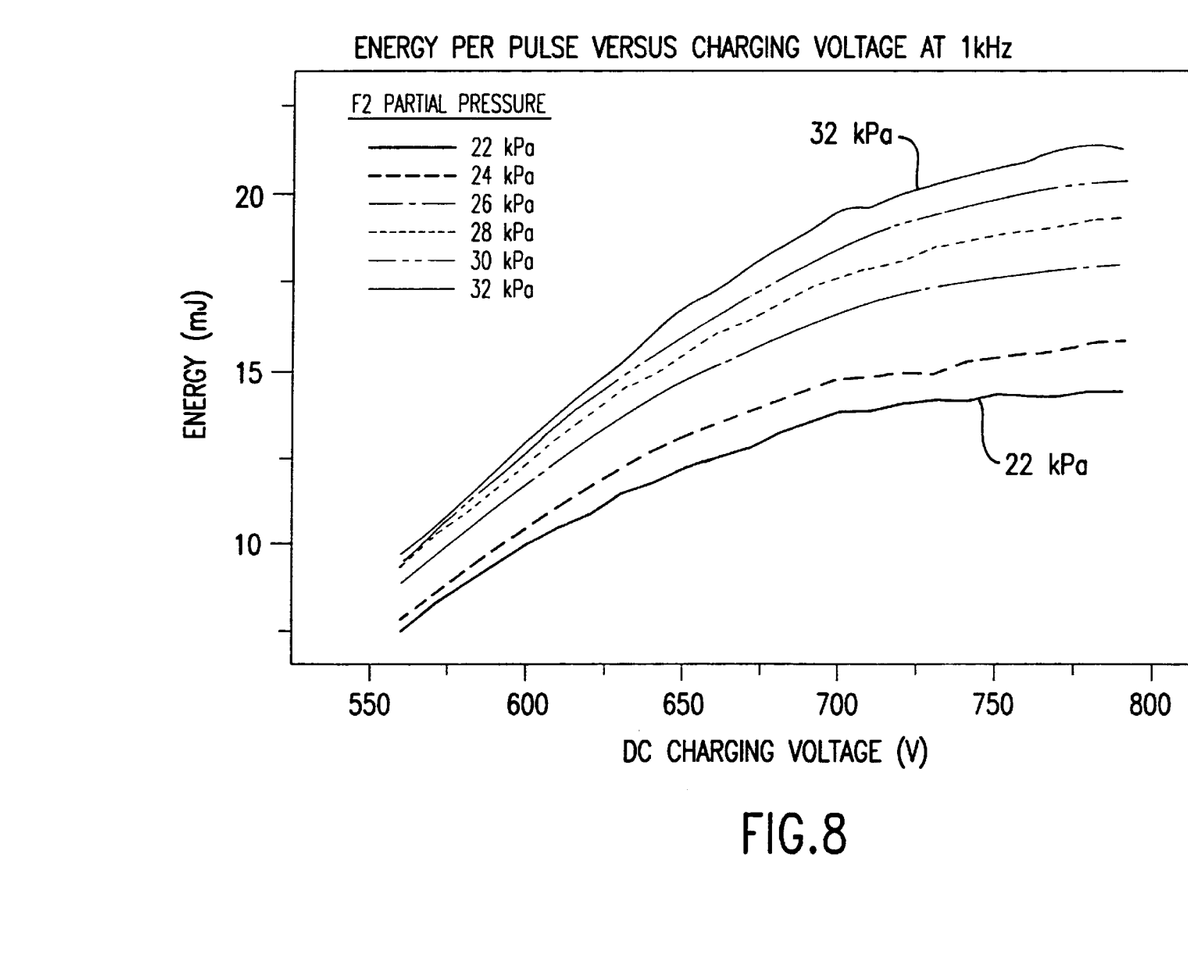
FIG. 8 shows the relationship of pulse energy with charging voltage at various fluorine concentrations.

As indicated in the Background section of this specification, FIG. 3 describes the effects of periodic fluorine injections. As explained above, typical $F_2$ injections (while controlling the laser to a constant pulse energy such as 10 mJ) will cause a decrease in the charging voltage of about 40 volts. If the laser is not controlled properly, these swings could cause operation outside desired ranges. When the fluorine concentration is relatively high such as following an injection, the charging voltage is relatively low. (See FIGS. 3 and 4). In this range, pulse energy is not greatly affected by small changes in the fluorine concentration. However, at higher voltage, the pulse energy becomes much more sensitive to fluorine concentration. A preferred method of operation is to periodically run a quick pulse energy scan in order to determine if the fluorine concentration is within a desired range. This can be done periodically such as immediately after a fluorine injection by setting the laser controls to create one of the curves shown in FIG. 8 such as the top one corresponding to an $F_2$ partial pressure of 32 kPa. This is done (using the FIG. 8 data as an example) by requiring the voltage to ramp up from about 560 volts to about 790 volts and measuring the pulse energy. This "quick calibration" can be performed in about two seconds after an injection and the resulting data tells the operator where the "sweet" operating range is. A sweet operating range is a range where the $\Delta E/\Delta V$ values are relatively constant and not too large and not too small. A good range for $\Delta E/\Delta V$ is from about 20 to 80 mJ/V, although the laser can operate satisfactorily so long as the $\Delta E/\Delta V$ is positive.

Algorithm for Reducing Pulse Energy and Burst Dose Variations

Improved equipment and software and a preferred process for reducing energy sigma and burst dose variation is described below.

As stated in the background section of this specification, the burst mode is a typical mode of operation of an excimer laser used for the light source of a stepper machine in the lithographic production integrated circuits. In this mode the laser is operated to produce "a burst" of pulse at the rate of 1,000 Hz for about 110 milliseconds to produce 110 pulses to illuminate a section of a wafer. After the burst the stepper moves the wafer and the mask and once the move is complete which takes typically a fraction of a second the laser produces another 110 pulse burst. Thus, normal operation is bursts of about 110 milliseconds followed by dead times of a fraction of a second. At various times, longer dead time periods will be provided so that other operations can be performed. This basic process continues 24 hours a day, 7 days per week, for several months with the laser typically producing several thousands of bursts per day. In the above burst mode, it is usually important that each section of the wafer received the same illumination energy on each burst. Also, chip makers want the pulse to pulse variation to be minimized.

This preferred embodiment of the present invention accomplishes these objectives with equipment and software which monitors the energy of each pulse (pulse N−1) then controls the energy of the next pulse (pulse N) based on the results of a:

1) a comparison of the measured energy of pulse N−1 with a target pulse energy and
2) a comparison of the accumulated dose of the burst through pulse N−1 to a target pulse dose through pulse N−1.

Reentry Slug

In the typical KrF excimer laser we have been discussing, the time required for gas in the laser chamber to make one round trip from the electrode around the chamber and back to the electrodes is about 30 milliseconds. Applicants have determined that with the laser operating at 1,000 Hz, there is on the average a substantial decrease in energy output at constant charging voltage for the pulses occurring about 30 milliseconds after the start of the burst (such as pulses, N=28, 29, 30, 31 and 32). Applicants believe this decrease in pulse energy (with constant charging voltage) is related to the return to the electrodes of the gas which was between the electrodes during the first pulse of the burst. Evidence of this is experimental results which show that the timing of the dip in output can be delayed by slowing down the gas circulation rate. Applicants refer to this gas returning from the first pulse as a "reentry slug". Also, the energy of the first pulse of a burst is typically substantially different than the subsequent pulses of the burst. After about 40 ms following the first pulse, the pulse energy at constant voltage is relatively constant. In dealing with these early pertabations, Applicants have separated the burst into two time-wire regions, the first region (consisting of a number of the earlier pulses, for example, 40 pulses) called the "K" region and a second region (consisting of the pulses which follow the K region) which Applicants, in this specification, refer to as the "L" region.

Equipment

This embodiment of the present invention utilizes prior art excimer laser equipment for pulse energy control. Pulse energy of each pulse of each burst is measured by photodiode 9. The response time of this photodiode array is less than 1 millisecond. The accumulated signal resulting from each approximately 20 ns pulse is stored and this signal is read by computer controller 22 approximately 1.0 microsecond after the beginning of the pulse. The accumulated energy of all the previous individual pulses in a burst is referred to as the burst dose value. Computer controller utilizes the signal representing the pulse energy of pulse N along with target pulse energy and the burst dose value in order to specify the high voltage for the pulse N+1. This calculation requires about 200 microseconds. When the value of high voltage for N+1 is determined, computer controller sends a signal to high voltage power supply 11 establishing the charging voltage for pulse N+1 which takes a few microseconds. Computer controller 22 commands high voltage power supply 11 to charge up capacitor Co to the specified voltage. (At high repetition rates it may be desirable to start the charging before the calculation is complete.) The charging requires about 400 microseconds so that Co is fully charged and ready to go when it receives a trigger signal for pulse N+1 from trigger circuit 13 at 1.0 millisecond after the trigger signal from pulse N. On the trigger signal, capacitor Co discharges its approximately 650 volts into the magnetic compression circuit shown in FIG. 2 over a period of about 5 microseconds and the pulse is compressed and amplified by the magnetic compression circuit to produce a discharge voltage on capacitor Cp of about 16,000 volts which discharges across electrodes 6 in about 100 ns producing a laser pulse of about 10 mJ and about 75 ns (95% integral) in duration.

Preferred Algorithm

A special preferred process for adjusting the charging voltage to achieve substantially desired pulse energies when operating in a burst mode is described below.

The process utilizes two voltage adjustment algorithms. The first algorithm applies to the first 40 pulses and is called the KPI algorithm. The second algorithm called the PI algorithm applies to pulses after pulse number 40. This time period after the 40$^{th}$ pulse is herein called the "L region" of the burst. The initials "PI" refer to "proportional integral" and the "K" in "KPI" refers to the "K region" of the burst.

KPI algorithm

The K region comprises pulses 1 through k, where k=40 for this preferred embodiment. The algorithm for setting the charging voltage for pulse N is:

$$V_N = (V_B)_N - (V_C)_{N-1} \quad N=1,2 \ldots k$$

where:

$V_N$=charging voltage for N'th pulse $(V_B)_N$=an array of k stored voltages which represents the current best estimate of the voltage required to produce the target energy $E_T$ for the N'th pulse in the K region. This array is updated after each burst according to the equation below.

$(V_C)_{N-1}$=a voltage correction based on the energy errors which occurred for the previous pulses in the burst, up to pulse N−1

$$= \sum_{i=1}^{N-1} \frac{(A \cdot \varepsilon_i + B \cdot D_i)}{(dE/dV)}$$

By definition, $(V_C)_0=0$.

A, B=fractions typically between 0 and 1, which in this preferred embodiment is 0.5

$\varepsilon_i$=the energy error of the i'th pulse $=E_i-E_r$, where $E_i$ is the energy for the i'th pulse, and $E_r$ is the target energy $D_i$=the cumulative dose error of the burst, including all pulses from 1 through i $$= \sum_{k=1}^{i} \varepsilon_k$$

dE/dV=a rate of change of pulse energy with charging voltage. (In this embodiment, one or more values of dE/dV is determined experimentally during each burst and a running average of these values is used for the calculation)

The stored values $(V_B)_N$ are updated during or after each burst according to the following relation:

$$(V_B)_N^{M+1} = (V_B)_N^M - C \cdot \left( \frac{\varepsilon_N}{dE/dV} - (V_C)_N \right),$$

where the index M refers to the burst number

C=a fraction typically between 0 and 1, which in this preferred embodiment is 0.3

PI algorithm

The L region comprises pulses k+1 to the end of the burst (for a preferred embodiment, pulse numbers 41 and higher). The algorithm for setting the charging voltage for pulse N is:

$$V_N = V_{N-1} - \frac{(A \cdot \varepsilon_{N-1} + B \cdot D_{N-1})}{(dE/dV)} \quad N = k+1, k+2, \ldots$$

where:

$V_N$=charging voltage for the N'th pulse $V_{N-1}$=charging voltage for N–1'st (previous) pulse The variables A, B, $\varepsilon_1$, $D_1$, and dE/dV are defined as before.

Determination of dE/dV

A new value for dE/dV is determined periodically, in order to track the relatively slow changes in the characteristics of the laser. In the preferred embodiment, dE/dV is measured by varying or "dithering" the voltage in a controlled way during two successive pulses in the L region. For these two pulses, the normal PI energy control algorithm is temporarily suspended and replaced by the following:

For pulse j $$V_j = V_{j-1} - \frac{(A \cdot \varepsilon_{j-1} + B \cdot D_{j-1})}{(dE/dV)} + V_{Dither}$$

where $V_{Dither}$=a fixed voltage increment, typically a few volts

For pulse j+1

$$V_{j+1} = V_j - 2 \cdot V_{Dither}$$

After pulse j+1, dE/dV is calculated:

$$dE/dV = \frac{(E_{j+1} - E_j)}{2 \cdot V_{Dither}}$$

The calculation of dE/dV can be very noisy, since the expected energy changes due to the dithering voltage can be of the same magnitude as the normal energy variation of the laser. In the preferred embodiment, a running average of the last 50 dE/dV calculations is actually used in the PI and KPI algorithms.

The preferred method for choosing $V_{Dither}$ is to specify a desired energy dither $E_{Dither}$, typically a few percent of the energy target $E_T$, and then use the current (averaged) value for dE/dV to calculate $V_{Dither}$:

$$V_{Dither} = \frac{E_{Dither}}{(dE/dV)}$$

Pulse j+2 (immediately following the two dithered pulses) is not dithered, but has the special value:

$$V_{j+2} = V_{j+1} + V_{Dither} - \frac{(A \cdot (\varepsilon_{j+1} + E_{Dither}) + B \cdot D_{j+1})}{(dE/dV)} \quad (\text{pulse } j+2)$$

This special value for $V_{j+2}$ is corrected for both the applied voltage dither and the expected energy dither from pulse j+1.

Many variations on the algorithm described above are possible. For example, dE/dV can be determined in the L region as well as the K. The dithering can be performed once per burst, or several times. The dithering sequence may be performed at a fixed pulse number j as described above, or it may be initiated for a randomly chosen pulse number which varies from one burst to the next.

The reader should recognize that A, B and C are convergence factors which could have many other values. Higher values than those specified above could provide quicker convergence but could lead to increase instability. In another preferred embodiment B is equal to the square root of A. This relationship is developed from a recognized technique to produce critical damping. B could be zero in which case there would be no close correction; however, A should not be zero.

If the calculated value of dE/dV becomes too small the above algorithm could cause over correction. Therefore a preferred technique is to arbitrarily double dE/dV if the energy sigma value exceeds a threshold. Default values of V and dE/dV are provided for the first pulse of a burst. D is set to zero at the start of each burst. The default dE/dV is set at about three times the expected dE/dV to avoid initial over correction.

An alternate method of determination of dE/dV without the dither referred to above is to merely measure and store the energy and voltage values during laser operation. (Specified rather than measured voltage values can also be used.) These data can be used to determine dE/dV as a function of V for constant pulse energy. The reader should note that each individual value of dE/dV will contain fairly large uncertainties because the elements of the value are differences of measurements having significant uncertainties. However, these uncertainties can be minimized by averaging large numbers of dE/dV values.

Although the present invention has been described with reference to a particular embodiment, it is to be appreciated that various adaptations and modifications may be made.

The dither exercise to determine ΔE does not have to be made on each burst but instead could be done periodically such as once every M bursts. Or the measurement of ΔE/ΔV could be replaced by a calculation performed by the computer or the value of ΔE/ΔV could be inserted manually by the operator of the laser.

The method used to select the charging voltage operating range can differ from the method described above and the operating range could be made smaller if by injecting fluorine more frequently than about once per two hours. In fact, the operating range could be made very small by continuous injections of fluorine at the rate needed to match fluorine depletion.

The values for $V_{N-1}$ are chosen from specified voltage values for the previous pulse for the calculation of $V_N$. An alternate approach would be to use the actual measured value for $V_{N-1}$ for this control system. Also the value of $V_{BIN}$ are calculated from specified values, not actual measured values in the above-described embodiment. An obvious alternative would be to use measured voltage values.

$E_T$ is normally a constant value such as 10 mJ but it does not have to be constant. For example, $E_T$ of the last ten pulses could be smaller than the nominal pulse energy so that percentage deviations from target $E_T$ for these pulses would have a smaller effect on the integrated pulse dose. Also, it may be preferable in some situations to program computer controller 22 to provide $E_T$ values that vary from burst to burst.

Therefore, the invention is to be limited only by the appended claims and their legal equivalents.

We claim:

1. A process for controlling pulse energy and integrated energy dose in a burst of pulses defining present burst pulses, $P_1, P_2 \ldots P_{N-1}, P_N$, from an excimer laser having a pulse power system including a high voltage charging system defining a charging voltage, said process comprising the steps of:

A) measuring the energy of each pulse in said burst of pulses,
   B) determining a rate of change of pulse energy with charging voltage, ΔE/ΔV,
   C) controlling the pulse energy of each pulse $P_N$ in at least one plurality of pulses in said burst of pulses by regulating the charging voltage of the laser utilizing a computer processor programmed with an algorithm which:
      1) determines for each $P_N$ a pulse energy error, ε, based on a measured energy of at least one previous pulse in said burst and a predetermined target pulse energy value,
      2) determines for each $P_N$ an integrated dose error, D, of all previous pulses, $P_1$ through $P_{N-1}$, in said burst,
      3) determines a charging voltage, $V_N$, for each of said pulses, $P_N$, in said first plurality of pulses using;
         i) said ΔE/ΔV
         ii) said ε
         iii) said D
         iv) at least one reference voltage,
   wherein said $V_N$ in said algorithm is a function of at least said ΔE/ΔV, said ε, said D and said at least one reference voltage, and values of said $V_n$, when calculated, are utilized to adjust said charging voltage to control both the individual pulse energy and the integrated energy dose to desired values.

2. A process as in claim 1 wherein said at least one previous pulse is $P_{N-1}$ and said reference voltage is a charging voltage specified for producing said $P_{N-1}$ in the present burst.

3. A process as in claim 1 wherein said present burst follows and defines a plurality of previous bursts and said at least one previous pulse is $P_{N-1}$ and said reference voltage is calculated based on charging voltage values determined for $P_N$ in each of a plurality of previous bursts.

4. A process as in claim 3 wherein said rate of change of pulse energy with charging voltage is determined by taking an average of a plurality of most recent values of said rate of change.

5. A process as in claim 1 wherein said present burst follows and defines a plurality of previous bursts, said at least one previous pulse is $P_{N-1}$ and said at least one plurality of pulses is two pluralities of pulses, defining a first plurality of pulses and a second plurality of pulses, a first reference voltage and a second reference voltage, wherein said first reference voltage is a charging voltage determined using data from $P_N$ of at least one previous burst and said second reference voltage is a charging voltage determined using data from $P_{N-1}$ of the present burst.

6. A process as in claim 5 wherein said algorithm comprises at least three converging factors.

7. A process as in claim 1 wherein said rate of change of pulse energy with charging voltage is determined periodically using at least two measured values of pulse energy obtained during bursts, each of said at least two measured values corresponding to a different value of charging voltage.

8. A process as in claim 7 wherein said rate of change of pulse energy with charging voltage is determined once during each of a series of bursts.

9. A process as in claim 1 wherein said rate of change of pulse energy with voltage is determined using a plurality of measured values of pulse energy and a specified value of charging voltage corresponding to each measured value of pulse energy in said plurality of measured values of pulse energy.

10. A process as in claim 1 wherein said rate of change of pulse energy with voltage is determined using a plurality of measured values of pulse energy and a measured value of charging voltage corresponding to each measured value of pulse energy in said plurality of measured values of pulse energy.

11. A process as in claim 1 wherein said algorithm comprises at least two converging factors.

12. A process for controlling pulse energy and integrated energy dose in a burst of pulses defining present burst pulses, $P_1, P_2 \ldots P_N \ldots P_K, P_{K+1}, P_{K+2} \ldots P_{K+N} \ldots P_1, P_2 \ldots P_{N+1}, P_N$, from an excimer laser having a pulse power system including a high voltage charging system defining a charging voltage, said process comprising the steps of:

A) measuring the energy of each pulse in said burst of pulses,
   B) determining a rate of change of pulse energy with charging voltage, ΔE/ΔV,
   C) controlling the pulse energy of each pulse $P_N$ the first K pulses, defining $P_K$ in said burst of pulses by regulating the charging voltage of the laser utilizing a computer processor programmed with a first algorithm which:
      (1) determines for each $P_N$ a pulse energy error, ε, based on a measured energy of at least one previous pulse in said burst and a predetermined target pulse energy value,
      2) determines for each $P_N$ an integrated dose error, D, of all previous pulses, $P_1$ through $P_{N-1}$, in said burst,
      3) determines a charging voltage, $V_N$, for each of said pulses, $P_N$, in said first plurality of pulses using:

i) said $\Delta E/\Delta V$
ii) said $\epsilon$
iii) said $D$
iv) a reference voltage based on specified voltages for $P_N$ in a plurality of previous bursts, D) controlling the pulse energy of each pulse $P_{K+N}$, in pulses following $P_K$ in said burst of pulses by regulating the charging voltage of the laser utilizing a computer processor programmmed with a second algorithm which:
   1) determines for each $P_{K+N}$, a pulse energy error, $\epsilon'$, based on a measured energy of at least one previous pulse in said burst and a predetermined target pulse energy value,
   2) determines for each $P_N$ an integrated dose error, $D'$, of all previous pulses, $P_1$ through $P_{N-1}$, in said burst,
   3) determines a charging voltage, $V_N$, for each of said pulses, $P_N$, in said first plurality of pulses using:
      i) said $\Delta E/\Delta V$
      ii) said $\epsilon'$
      iii) said $D'$
      iv) a reference voltage based on a specified voltage for pulse $P_{N-1}$, wherein said $V_N$'s in said first and second algorithms are functions of at least said $\Delta E/\Delta V$, said $\epsilon$, said $D$ and said at least one reference voltage, and values of said $V_N$, when calculated, are utilized to adjust said charging voltage to control both the individual pulse energy and the integrated energy dose to desired values.

13. A process as in claim 12 wherein said algorithm further comprises at least three converging factors each having values between 0 and 1.

* * * * *